United States Patent
Yang et al.

[11] Patent Number: 6,039,770
[45] Date of Patent: Mar. 21, 2000

[54] SEMICONDUCTOR DEVICE MANUFACTURING SYSTEM HAVING MEANS FOR REDUCING A PRESSURE DIFFERENCE BETWEEN LOADLOCK AND PROCESSING CHAMBERS

[75] Inventors: Yun-sik Yang; Hun Cha, both of Suwon; Seung-ki Chae, Seoul, all of Rep. of Korea

[73] Assignee: Samsung Electronics Co., Ltd., Suwon, Rep. of Korea

[21] Appl. No.: 09/090,862

[22] Filed: Jun. 5, 1998

[30] Foreign Application Priority Data

Jun. 25, 1997 [KR] Rep. of Korea ............... 97-27092

[51] Int. Cl.[7] .................................................. C23C 14/00
[52] U.S. Cl. ...................... 29/25.01; 204/298.25; 118/719; 118/50
[58] Field of Search .............. 29/25.01; 204/298.25, 204/298.26, 298.35; 438/908; 118/719, 50

[56] References Cited

U.S. PATENT DOCUMENTS 4,643,627 2/1987 Bednorz et al. .
5,549,716 8/1996 Takahashi et al. .

*Primary Examiner*—David E. Graybill
*Attorney, Agent, or Firm*—Jones Volentine, LLP

[57] ABSTRACT

A semiconductor manufacturing system includes a loadlock chamber, a low level vacuum pump connected to said loadlock chamber so as to create a low level vacuum in the loadlock chamber, a processing chamber in which a semiconductor manufacturing process is carried out while the processing chamber is maintained at a high level vacuum, a gate valve interposed between and connecting the loadlock chamber and the processing chamber, and a pressure relieving device for reducing the pressure difference between the low level vacuum of the loadlock chamber and the high level vacuum of the processing chamber at the time the gate valve is opened. The pressure relieving device is a high level vacuum pump which can be dedicated to the loadlock chamber or which can be the same pump as that used to evacuate the processing chamber. The high level vacuum pump is connected to the loadlock chamber by an air valve. The system is operated under a method in which air is fed to both the air valve and with a certain delay thereafter to the gate valve. The air valve opens first, and the high level vacuum pump evacuates the loadlock chamber before the fed air opens the gate valve. In this way, particles in the loadlock chamber are prevented from being induced into the processing chamber at the time of transfer of objects from the loadlock chamber to the processing chamber through the gate valve.

17 Claims, 2 Drawing Sheets

SEMICONDUCTOR DEVICE MANUFACTURING SYSTEM HAVING MEANS FOR REDUCING A PRESSURE DIFFERENCE BETWEEN LOADLOCK AND PROCESSING CHAMBERS

BACKGROUND OF THE INVENTION

1. Field of the Invention

The present invention relates to a semiconductor manufacturing system and to a method of operating such a system. More particularly, the present invention relates to a semiconductor manufacturing system comprising a loadlock chamber maintained at a low level vacuum, a processing chamber maintained at a high level vacuum, and a gate valve interposed between the loadlock chamber and the processing chamber.

2. Description of the Related Art

Generally, a semiconductor device manufacturing process is performed inside a processing chamber which is maintained under a high vacuum. The process is carried out with a gas having a relatively low particle density (number of gas particles per volume of the chamber).

However, when the wafers to be processed are supplied into the processing chamber, a vortex is often generated by the difference in pressure between the inside and outside of the chamber. Therefore, the particles outside the processing chamber are induced into the chamber by the vortex, thereby causing a processing failure to occur in the subsequent semiconductor manufacturing process.

Generally, the wafers associated with this process first pass through a loadlock chamber maintained at a pressure of 100 to 500 mTorr. From there, the wafers are moved into the processing chamber which is maintained at a pressure of less than 10 mTorr, which represents a much higher level vacuum than that of the loadlock chamber.

FIG. 1 shows a loadlock chamber 10 in which wafers are processed. The loadlock chamber 10 is connected to a low vacuum level pump 12 by a loadlock chamber low level vacuum line 14 in which an isolation valve 16 is disposed.

FIG. 1 also shows a processing chamber 18 in which a semiconductor device manufacturing process is performed using a processing gas. The processing chamber 18 is connected to a low vacuum level pump 24 through a processing chamber high level vacuum line 26 in which a discharge valve 20, a high vacuum level pump 22, and an isolation valve 28 are disposed in the order of flow of discharge gas.

The loadlock chamber 10 and the processing chamber 18 are connected to each other by a gate valve 30. The gate valve 30 is connected to an air source 36 by an air supply line system 35 which comprises an opening line 32 and a closing line 34. The gate valve 30 is opened when a certain amount of air is supplied into the gate valve 30 through the opening line 32, and is closed when a certain amount of air is supplied thereinto through the closing line 34.

Therefore, when the wafers to be processed are introduced into the loadlock chamber 10 under a normal atmospheric state, the isolation valve 16 is opened, and the pressure of the loadlock chamber 10 is maintained at a constant low vacuum level by the low level vacuum pump 12.

Then, a certain amount of air from the air source 36 is supplied to the gate valve 30 through the opening line 32 of the air supply line system 35. Consequently, the gate valve 30 is opened.

Then, after a certain low level vacuum is produced by the low level vacuum pump 24 with the discharge valve 20 open, the wafers are moved into the processing chamber 18. This processing chamber 18 is maintained at a high vacuum level by the high level vacuum pump 22.

Finally, the semiconductor device manufacturing process using a processing gas is performed inside the processing chamber 18, whereby by-products accumulate inside the processing chamber. However, when the gate valve 30 is opened to facilitate the transfer of wafers, a vortex occurs due to the pressure difference between the loadlock chamber 10 and the processing chamber 18 which are maintained at a low level vacuum and a high level vacuum, respectively. Therefore, the particles existing inside the loadlock chamber 10 are induced into the processing chamber 18, and the by-products accumulated in the processing chamber 18 are scattered in the processing chamber 18. Consequently, the wafers become contaminated.

In addition, the vortex applies pressure to the gate valve 30 interposed between the loadlock chamber 10 and the processing chamber 18. As a result, the life of the gate valve 30 is shortened.

SUMMARY OF THE INVENTION

An object of the present invention is to provide a semiconductor device manufacturing system, and a method of operating such a system, for preventing a vortex from being generated when a gate valve, interposed between a loadlock chamber (maintained at a low level vacuum) and a processing chamber (maintained at a high level vacuum), is opened.

To achieve this and other objects and advantages, the present invention provides a semiconductor device manufacturing system including a loadlock chamber connected to a low level vacuum pump and a processing chamber connected to a high level vacuum pump. A gate valve is interposed between the loadlock chamber and the processing chamber. A pressure relieving means is provided for reducing the pressure difference between the low vacuum level of the loadlock chamber and the high vacuum level of the processing chamber when the gate valve is opened.

The pressure relieving means is a high level vacuum pump connected to the loadlock chamber in order to form a high level vacuum inside the loadlock chamber. Therefore, the high level vacuum pump constituting the pressure relieving means can be the same high level vacuum pump which is connected to the processing chamber.

In addition, an opening/closing valve is disposed in the high level vacuum line which connects the high level vacuum pump to the loadlock chamber. A filter can be interposed between the loadlock chamber and the opening/closing valve to filter gas flowing through the high level vacuum line. A manual valve is provided in-line between the loadlock chamber and the filter.

The system is provided with a mechanism to open the gate valve once the pressures in the loadlock chamber and the processing chamber become equal. To this end, an air source is connected to the gate valve by a system of air supply lines. An air valve is disposed in the high level vacuum line connecting the high level vacuum pump to the loadlock chamber. The air valve is connected to the air supply line system.

The system of air supply lines includes an opening line and a closing line. A delay means, such as a needle valve, is disposed in the opening line at a location between the gate valve and a point where the air supply line system is branched to the air valve. The delay means provides a delay for the opening of the gate valve, thereby causing the gate valve to open at some time after the pressures in the loadlock and processing chambers have equalized.

The method of operating the system described above comprises the steps of: loading the object(s) to be processed into the loadlock chamber and operating the low level vacuum pump to maintain the loadlock chamber at a low vacuum level; operating the high level vacuum pump to maintain the processing chamber at a high vacuum level; subsequently opening the air valve to place the high level vacuum pump in open communication with the loadlock chamber and continuing to operate the high level vacuum pump until the loadlock chamber assumes a constant high vacuum level; subsequently opening the gate valve; and subsequently transferring the object(s) from the loadlock chamber to the processing chamber. Once the object(s) is/are in the processing chamber, the gate valve is closed and the object(s) are processed using a processing gas.

BRIEF DESCRIPTION OF THE DRAWINGS

The present invention and its advantages will be described with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
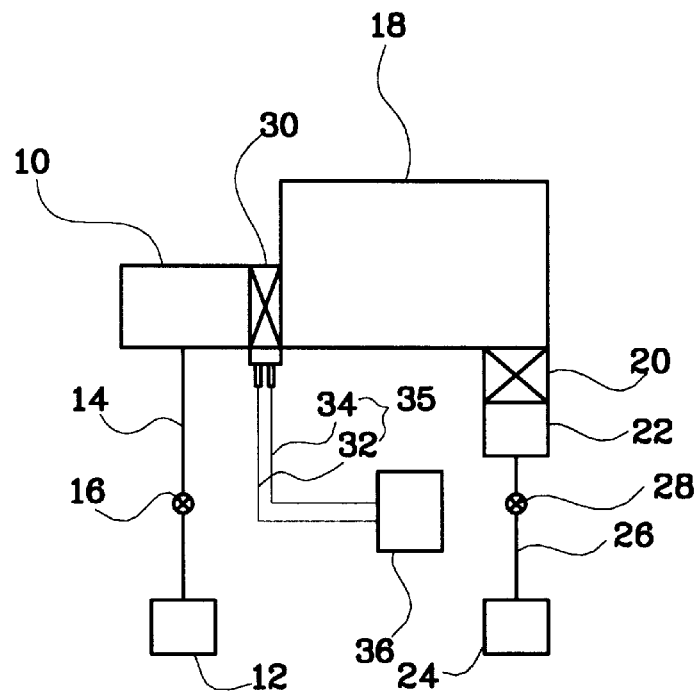
FIG. 1 is a schematic diagram of a conventional semiconductor manufacturing system.
Figure 2:
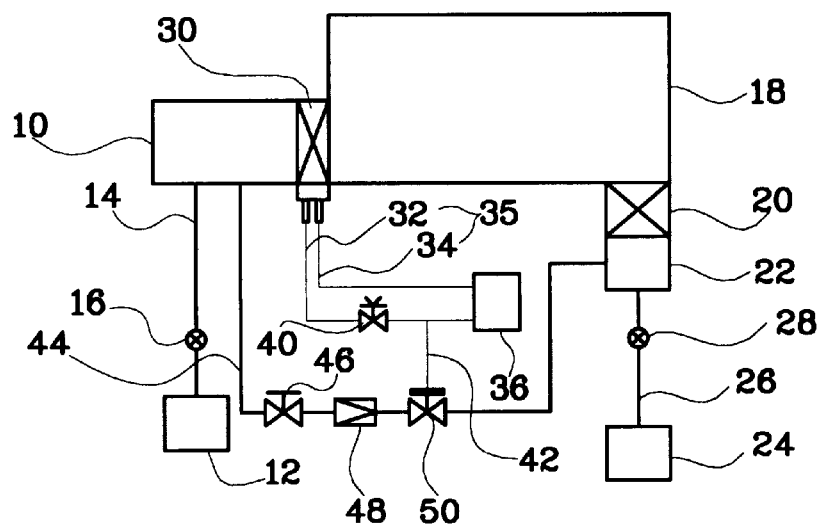
FIG. 2 is a schematic diagram of one embodiment of a semiconductor manufacturing system according to the present invention.

FIG. 2 is a schematic diagram of one embodiment of a semiconductor manufacturing system according to the present invention. In FIG. 2, a loadlock chamber 10 accommodates wafers under a low level vacuum. The loadlock chamber 10 is connected to a low level vacuum pump 12, such as a dry pump. The vacuum pump 12 is connected to the loadlock chamber by a low level vacuum line 14 having an isolation valve 16 therein.

In addition, a processing chamber 18 is used for holding semiconductor wafers under a high level vacuum below 10 mTorr while the wafers are processed using a gas having a low particle density. The processing chamber 18 is connected to a low level vacuum pump 24, such as a dry pump, by a processing chamber high level vacuum line 26. A discharge valve 20, a high level vacuum pump 22, such as a turbo pump, and an isolation valve 28 are disposed in the high level vacuum line 26 in the foregoing order as taken in the direction of flow of the gas discharged from the processing chamber 18.

A gate valve 30 is interposed between the loadlock chamber 10 and the processing chamber 18. The gate valve 30 is connected to an air source 36 by an air supply line system 35 comprising an opening line 32 and a closing line 34. In addition, the gate valve 30 is opened/closed by a predetermined amount of air which is selectively supplied through the opening line 32 and the closing line 34. A delay valve 40, such as a needle valve, is provided in the opening line 32 to bleed air in the opening line 32 to the gate valve 30.

In addition, the bottom of the loadlock chamber 10 is connected to the high level vacuum pump 22 by a high level vacuum line 44. A manual valve 46 which is opened and closed by an operator of the system, a filter 48, and an air valve 50 are disposed in the high level vacuum line 44 in the foregoing order as taken in the direction of flow of gas discharged from the loadlock chamber by the high level vacuum pump 22. An air divergence line 42 is connected at one end between the air source 36 and delay valve 40, and connected at the other end to air valve 50.

Figure 3:
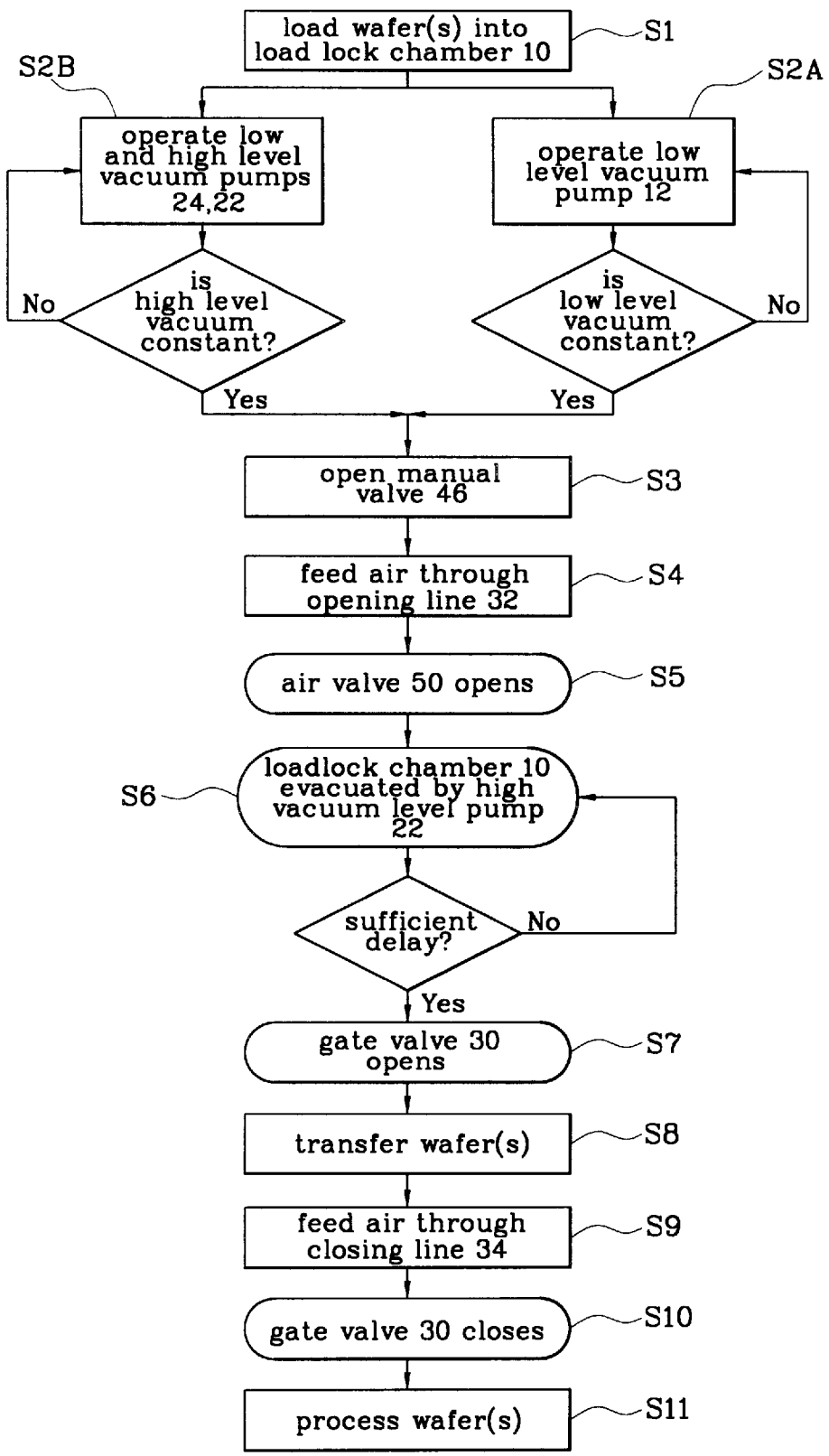
FIG. 3 is a flowchart illustrating the method of operating the semiconductor manufacturing system according to the present invention.

Referring now to both FIGS. 2 and 3, when the semiconductor wafers are to be loaded (S1) into the loadlock chamber 10, the isolation valve 16 is opened. Accordingly, the loadlock chamber 10 is maintained at a constant low vacuum level by the low level vacuum pump 12 (S2A) connected to the loadlock chamber 10 by the low level vacuum line 14.

In addition, the discharge valve 20 in the processing chamber high level vacuum line 26 is opened, and the processing chamber 18 is maintained at a constant low vacuum level by the low level vacuum pump 24. Subsequently, the processing chamber 18 is set to a high vacuum level of a pressure below 10 mTorr by the high level vacuum pump 22 (S2B).

Then, the manual valve 46 in the high level vacuum line 44 is opened by the operator (S3). Next, a certain amount of air is discharged from the air source 36 (S4) through the opening line 32 of the air supply line system 35. The air induced into the opening line 32 passes through the delay valve 40 and is thus supplied to the gate valve 30 in small measured amounts.

Meanwhile, a certain amount of the air discharged into the opening line 32 passes through the air divergence line 42 and is supplied to the air valve 50 disposed in the high level vacuum line 44. Accordingly, the air valve 50 is opened (S5).

Therefore, the high level vacuum pump 22 evacuates the loadlock chamber 10 through the now open air valve 50, filter 48, and manual valve 46 disposed in the high level vacuum line 44 (S6).

The discharged gas from the loadlock chamber 10, including the particles existing in the loadlock chamber 10, is forced through the manual valve 46 by the high level vacuum pump 22, passes through the filter 48 where the particles are filtered out, passes through the air valve 50 and the processing chamber high level vacuum line 26, until the loadlock chamber 10 assumes a high vacuum level equal in pressure to that of the processing chamber 18.

When the pressure of the loadlock chamber 10 equals that of the processing chamber 18, enough air from the air source 36 has passed through the delay valve 40 to open the gate valve 30 (S7).

Then, the wafers inside the loadlock chamber 10 are transferred to the processing chamber 18 through the open gate valve 30 (S8). The air source 36 is then controlled to stop supplying air into the opening line 32, and instead supplies air to the closing line 34 (S9) so as to close the gate valve 30 (S10). The semiconductor device manufacturing process is performed under the high vacuum level maintained in the processing chamber 18 (S11).

In another embodiment of the present invention, a high level vacuum pump separate from that used to evacuate the processing chamber 18 can be used to reduce the pressure difference between the processing chamber 18 and the loadlock chamber 10. In this embodiment, it is the separate high level vacuum pump that is connected to the loadlock chamber 10 by the high level vacuum line 44.

The present invention thus overcomes the defect in the prior art of the vortex produced, when the gate valve is opened, due to the pressure difference between the processing chamber and the loadlock chamber which are separated by the gate valve. Accordingly, when practicing the present invention, particles existing in the loadlock chamber will not be induced into the processing chamber when the wafers are transferred from the loadlock chamber into the processing chamber. This in turn prevents the by-products of the process that is carried out in the processing chamber from being scattered and contaminating the wafers.

Still further, relieving the pressure difference at the time of transfer of the wafers from the loadlock chamber into the processing chamber enhances the useful life of the gate valve.

Although the present invention has been described in detail, it should be understood that various changes, substitutions and modifications can be made thereto without departing from the true spirit and scope of the present invention as define by the appended claims.

What is claimed is:

1. A semiconductor manufacturing system comprising:
   a loadlock chamber;
   a low level vacuum pump connected to said loadlock chamber so as to create a low level vacuum in said loadlock chamber;
   a processing chamber in which a semiconductor manufacturing process is carried out while the processing chamber is maintained at a high level vacuum of a pressure that is less than that of said low level vacuum;
   a gate valve interposed between and connecting said loadlock chamber and said processing chamber, said gate valve being movable between a closed position at which said processing chamber is isolated from said loadlock chamber and an open position at which said chambers are open to each other so as to facilitate the transfer of objects from said loadlock chamber to said processing chamber; and
   pressure relieving means for reducing the pressure difference between the low level vacuum of said loadlock chamber and the high level vacuum of said processing chamber when the gate valve is moved from said closed to said open position thereof.

2. The semiconductor manufacturing system as claimed in claim 1, wherein said pressure relieving means comprises a high level vacuum pump, and a high level vacuum line connecting said high level vacuum pump to said loadlock chamber so as to produce a high level vacuum in said loadlock chamber.

3. The semiconductor manufacturing system as claimed in claim 2, wherein said high level vacuum pump is also connected to said processing chamber.

4. The semiconductor manufacturing system as claimed in claim 2, further comprising opening/closing means, disposed in said high level vacuum line, for opening and closing said high level vacuum line between said high level vacuum pump and said loadlock chamber.

5. The semiconductor manufacturing system as claimed in claim 4, further comprising a filter disposed in said high level vacuum line between said loadlock chamber and said opening/closing means.

6. The semiconductor manufacturing system as claimed in claim 5, further comprising a manual valve disposed in said high level vacuum line between said loadlock chamber and said filter.

7. A semiconductor manufacturing system comprising:
   a loadlock chamber;
   a low level vacuum pump connected to said loadlock chamber so as to create a low level vacuum in said loadlock chamber;
   a processing chamber in which a semiconductor manufacturing process is carried out while the processing chamber is maintained at a high level vacuum of a presuure that is less than that of said low level vacuum;
   an air actuatable gate valve interposed between and connecting said loadlock chamber and said processing chamber, said gate valve being movable between a closed position at which said processing chamber is isolated from said loadlock chamber and an open position at which said chambers are open to each other so as to facilitate the transfer of objects from said loadlock chamber to said processing chamber;
   an air supply line system connected to said gate valve and through which system air passes to move said gate valve between said open and closed positions thereof;
   a high level vacuum pump;
   a high level vacuum line connecting said high level vacuum pump to said loadlock chamber, whereby said loadlock chamber can also be evacuated to a high level vacuum of a pressure that is less than that of said low level vacuum; and
   an air valve disposed in said high level vacuum line, said air valve being movable by air between an open position at which said high level vacuum pump is in open communication with said loadlock chamber and a closed position at which said high level vacuum line is closed between said high level vacuum pump and said loadlock chamber, said air valve being operatively connected to said air supply line system so as to be opened by air passing through said system to open said gate valve.

8. The semiconductor manufacturing system as claimed in claim 7, further comprising delay means, disposed in said air supply line system, for creating a delay in the passing of air through said air supply line system toward said gate valve.

9. The semiconductor manufacturing system as claimed in claim 8, wherein said air supply line system comprises an opening line through which air passes to open said gate valve, and a closing line through which air passes to close said gate valve, and said delay means is disposed in said opening line at a location between said gate valve and a point where said air valve is connected to said air supply line system.

10. The semiconductor manufacturing system as claimed in claim 7, wherein said high level vacuum pump is also connected to said processing chamber so as to create said high level vacuum therein.

11. The semiconductor manufacturing system as claimed in claim 7, further comprising a filter disposed in said high level vacuum line between said air valve and said loadlock chamber.

12. The semiconductor manufacturing system as claimed in claim 8, wherein said delay means is a needle valve.

13. The semiconductor manufacturing system as claimed in claim 9, wherein said delay means is a needle valve.

14. A method of operating a semiconductor system which includes a loadlock chamber, a low level vacuum pump connected to said loadlock chamber, a processing chamber, a gate valve interposed between and connecting said loadlock chamber and said processing chamber, said gate valve being movable between a closed position at which said processing chamber is isolated from said loadlock chamber and an open position at which said chambers are open to each other, a high level vacuum line connecting said high level vacuum pump to said loadlock chamber, and an air valve disposed in said high level vacuum line, said air valve being movable by air between an open position at which said high level vacuum pump is in open communication with said loadlock chamber and a closed position at which said high level vacuum line is closed between said high level vacuum pump and said loadlock chamber, said method comprising:

loading at least one object to be processed into the loadlock chamber and operating the low level vacuum pump to maintain the loadlock chamber at a constant low vacuum level;

evacuating the processing chamber until the processing chamber is maintained at a constant high vacuum level of a pressure that is less than that of said low vacuum level;

subsequently opening the air valve to place the high level vacuum pump in open communication with the loadlock chamber and operating the high level vacuum pump until the loadlock chamber assumes a constant high vacuum level of a pressure that is less than that of said low vacuum level, whereby a pressure differential between the loadlock chamber and the processing chamber is reduced;

subsequently opening the gate valve; and subsequently transferring the at least one object from the loadlock chamber to the processing chamber through the open gate valve.

15. The method of operating a semiconductor manufacturing system as claimed in claim 14, and in which manufacturing system the high level vacuum pump is connected to said processing chamber, wherein the step of evacuating the processing chamber comprises operating the high level vacuum pump connected thereto.

16. The method of operating a semiconductor manufacturing system as claimed in claim 14, and which manufacturing system further includes an air supply line system connected to the gate valve, and a divergence air line connecting the air supply line system to the air valve, wherein the steps of opening the gate valve and the air valve comprise feeding air from an air source through the air supply line system toward the gate valve.

17. The method of operating a semiconductor manufacturing system as claimed in claim 15, and which manufacturing system further includes an air supply line system connected to the gate valve, and a divergence air line connecting the air supply line system to the air valve, wherein the steps of opening the gate valve and the air valve comprise feeding air from an air source through the air supply line system toward the gate valve.

* * * * *